(12) United States Patent
Wilson et al.

(10) Patent No.: US 6,251,789 B1
(45) Date of Patent: Jun. 26, 2001

(54) SELECTIVE SLURRIES FOR THE FORMATION OF CONDUCTIVE STRUCTURES

(75) Inventors: Arthur M. Wilson; Jody D. larsen, both of Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/464,156

(22) Filed: Dec. 16, 1999

Related U.S. Application Data

(60) Provisional application No. 60/112,472, filed on Dec. 16, 1998.

(51) Int. Cl.[7] .................................................. H01L 21/302
(52) U.S. Cl. .......................... 438/693; 438/584; 438/622; 438/628; 438/631; 438/633; 438/637; 438/639; 438/648; 438/687; 438/692; 438/696
(58) Field of Search ..................................... 438/584, 622, 438/628, 631, 633, 637, 639, 648, 687, 692, 693, 696

(56) References Cited

U.S. PATENT DOCUMENTS

| | | | |
|---|---|---|---|
| 5,960,317 | * | 9/1999 | Jeong ..................................... 438/633 |
| 6,071,816 | * | 6/2000 | Watts et al. ........................... 438/692 |
| 6,083,840 | * | 7/2000 | Mravic et al. ........................ 438/693 |

* cited by examiner

*Primary Examiner*—Charles Bowers
*Assistant Examiner*—Lisa Kilday
(74) *Attorney, Agent, or Firm*—Wade James Brady, III; Frederick J. Telecky, Jr.

(57) ABSTRACT

An embodiment of the instant invention is a method of fabricating a semiconductor device with a patterned dielectric layer having an upper surface and an opening with a bottom and sidewalls formed over a semiconductor substrate, the method comprising the steps of: forming a liner layer (layer 434 of FIGS. 1*b*–1*d*) on the upper surface of the patterned dielectric layer and on the bottom and the sidewalls of the opening in the patterned dielectric layer; forming a conductive layer (layer 436 of FIGS. 1*b*–1*d*) on the liner layer; removing the portion of the conductive layer which overlies the top surface of the dielectric layer thereby exposing a portion of the liner layer while leaving the portion of the conductive layer situated in the opening of the dielectric layer substantially unremoved, the step of removing the portion of the conductive layer is accomplished by chemical mechanical polishing using a first slurry; removing the exposed portion of the liner layer while leaving the unexposed portion of the liner layer substantially unremoved by chemical mechanical polishing using a second slurry; and wherein the first slurry removes the conductive layer much more readily than the liner layer and the second slurry removes the liner layer more readily than the conductive layer.

13 Claims, 3 Drawing Sheets

SELECTIVE SLURRIES FOR THE FORMATION OF CONDUCTIVE STRUCTURES

This application claims priority under 35 USC §119(e)(1) of provisional application No. 60/112,472 filed Dec. 16, 1998.

CROSS-REFERENCE TO RELATED PATENT/PATENT APPLICATIONS

The following commonly assigned patent/patent applications are hereby incorporated herein by reference:

| Pat. No. /Ser. No. | Filing Date | TI Case No. |
|---|---|---|
| //1998 | | TI-26895 |
| | | TI-26896 |
| | | TI-27373 |

FIELD OF THE INVENTION

The instant invention pertains to semiconductor device fabrication and processing and more specifically to a novel chemical-mechanical slurry and a method of selectively removing a conductive structure while leaving the underlying liner layer substantially non-removed.

BACKGROUND OF THE INVENTION

Two trends present in the semiconductor device-manufacturing arena involve the desire to have planar structures and lessening the resistivity of conductive structures. Chemical-mechanical polishing (CMP) is being utilized with greater and greater frequency to achieve both of these trends. Most semiconductor manufacturers use CMP to planarize interlevel dielectric layers and to planarize some metal structures. The most common approach used in the CMP industry is to attach a semiconductor wafer to a carrier (which may or may not rotate) via a mounting pad and polish the exposed surface of the wafer by bringing it into contact with a polishing pad (which is mounted on a rotating or non-rotating platen). The mechanical abrasion between the wafer surface and the polishing pad results in the polishing of the wafer surface. To aid in the polishing and the removal of any particles liberated in this process, slurry can be introduced between the wafer surface and the polishing pad. The slurry will interact with the wafer surface thereby making the wafer more easily polishable and the excess slurry will carry away the materials liberated from the wafer during this polishing step.

Most processes used in the semiconductor industry, today, involve the formation of a layer of either conductive or insulating material followed by the planarization (typically CMP) of the material. For example, a dielectric layer, which is quite thick in comparison to other structures, is typically deposited over the entire wafer. Due to the underlying topology the upper surface of this layer varies in height by a fairly appreciable amount. Using present lithography methods and equipment, the via holes/trenches, that are to be patterned in this layer to form the conductive interconnects, are difficult to fabricate because of the variance in the height of this upper surface. Hence, a planarization step is required prior to the patterning of these holes. This step is, typically, accomplished by CMP, which results in a relatively planar upper surface of the dielectric layer.

In addition, CMP is being utilized after the blanket formation of a conductive material (such as tungsten, copper, aluminum, or other metal) so as to form inlaid conductive structures such as vias and/or interconnects. In fact, some conductive structures, e.g. copper structures, are not easily formed without using CMP because there really does not exist an etchant which effectively removes copper without substantially degrading the layers which underlie the copper structure. The use of CMP, as opposed to, for example, reactive ion etching ("RIE"), is both cleaner and results in a more planar structure. Typically, metallization schemes are formed using CMP by first forming the openings in a dielectric layer for the vias and/or interconnects and then forming a blanket (or selectively) coating of the conductive material so as to fill up the vias and/or interconnect openings. In order to properly fill these openings, an excess amount of the conductor is preferably formed over the wafer. This results in the formation of the conductive material over the dielectric layer in regions other than the openings. In order to remove this excess material, a CMP process is performed.

In order to reduce the resistivity of the conductors which span the largest part of the device and which carry a majority of the signals, most device manufacturers are trying to utilize copper for their upper level conductors. While copper has better electromigration properties and lower resistivity than traditional conductors, e.g. aluminum and tungsten, copper is more difficult to pattern because, at present, there does not exist an effective copper etchant which does not substantially degrade the structures which underlie the copper structure. Hence, many device manufacturers are trying to use CMP to form the copper structures. As was stated above, the CMP process is used to not only remove the excess portion of copper which overlies the dielectric layer but also to remove the barrier/liner layer which underlies the copper layer. This underlying layer is important because it helps promote the adhesion of the copper layer to the wafer and it provides a barrier between the copper structure and the dielectric layer. The conventional practice and all of the research efforts geared at coming up with new slurries and CMP techniques involve the removal of both the excess copper and liner/barrier layers in one step using one CMP tool and a single slurry. However, the removal of both of these layers can cause "dishing" of the copper structure and erosion of the underlying dielectric layer.

SUMMARY OF THE INVENTION

An embodiment of the instant invention is a method of fabricating a semiconductor device with a patterned dielectric layer having an upper surface and an opening with a bottom and sidewalls formed over a semiconductor substrate, the method comprising the steps of: forming a liner layer on the upper surface of the patterned dielectric layer and on the bottom and the sidewalls of the opening in the patterned dielectric layer; forming a conductive layer on the liner layer; removing the portion of the conductive layer which overlies the top surface of the dielectric layer thereby exposing a portion of the liner layer while leaving the portion of the conductive layer situated in the opening of the dielectric layer substantially unremoved, the step of removing the portion of the conductive layer is accomplished by chemical mechanical polishing using a first slurry; removing the exposed portion of the liner layer while leaving the unexposed portion of the liner layer substantially unremoved by chemical mechanical polishing using a second slurry; and wherein the first slurry removes the conductive layer much more readily than the liner layer and the second slurry removes the liner layer more readily than the conductive layer. Preferably, the liner layer is comprised of: Ta, TaN, Ta/TaN stack, Ti, TiN, a Ti/TiN stack, a refractory metal, and any combination thereof, and the conductive layer is comprised of: copper, a copper alloy, tungsten, aluminum, a refractory metal, and any combination thereof. The first slurry, preferably, removes around 100 parts (or around 50 parts, or around 20 to 30 parts or around 15 parts) of the conductive layer to every one part of the liner layer. Preferably, the second slurry has a pH around 11 to 12, and is comprised of particulate and a wetting agent. The particulate is, preferably, around 2 to 5 percent by weight of the total composition of the second slurry. Preferably, the second slurry removes around 20 parts (or preferably around 12 parts or preferably around 10 parts) of the liner layer to every one part of the conductive layer.

BRIEF DESCRIPTION OF THE DRAWINGS

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

Figure 1A:
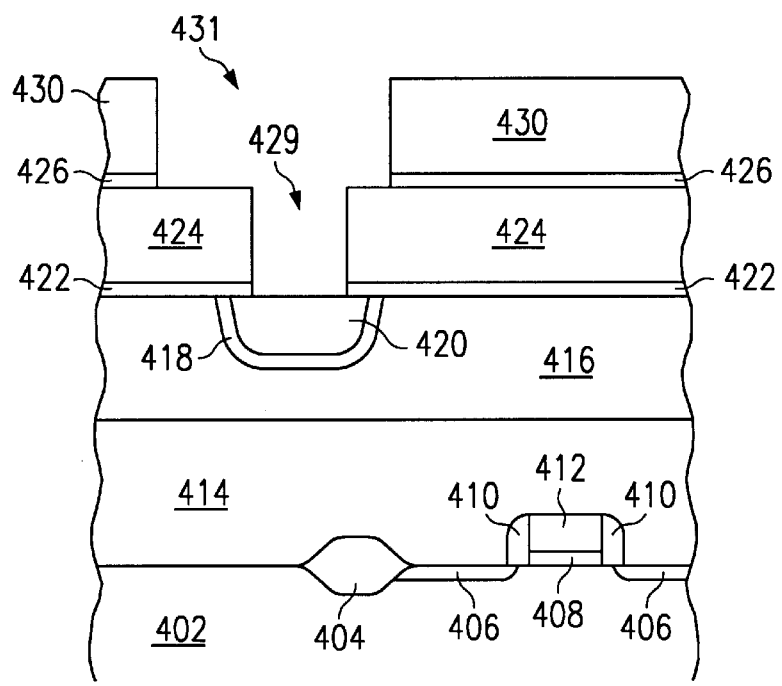
FIGS. 1a–1d are cross-sectional views of a partially fabricated device, which is fabricated using the method of one embodiment of the instant invention.

Referring to FIG. 1a, after providing substrate 402, isolation region 404 (which could be formed using LOCOS, field oxidation, or shallow trench isolation techniques), source/drain regions 406, gate dielectric 408, conductive gate structure 412, sidewall insulators 410, dielectric layer 414 (preferably comprised of BPSG, PSG, silicon oxide, oxide/nitride stack, TEOS, a low dielectric constant material, or any other interlevel dielectric material—in fact, regions 414 and 416 can be one layer) liner/barrier layer 418 (preferably comprised of Ti, TiN, or a Ti/TiN stack), conductor 420 (preferably comprised of aluminum, copper, copper-doped aluminum, or any refractory metal), barrier layer 422 (preferably comprised of silicon nitride), and dielectric layer 424 (preferably comprised of FSG, BPSG, PSG, TEOS, aerogel, xerogel, HSQ or any other low dielectric constant material) are formed. Hard mask 426 (preferably comprised of silicon nitride) is used to define the opening in dielectric layer 424. A dielectric material is formed on hardmask 426. Preferably, dielectric layer 430 is comprised of TEOS, FSG, BPSG, PSG, HSQ, or a low dielectric constant material, such as aerogel, xerogel, or a polymer (such as fluorinated parylene). Dielectric layer 430 is preferably either spun on or deposited using chemical vapor deposition (CVD). This is followed by an etch process to remove portions of dielectric layers 430 and 424, and create the via opening 429. Preferably, this etch process is an anisotropic process.

Figure 1B:
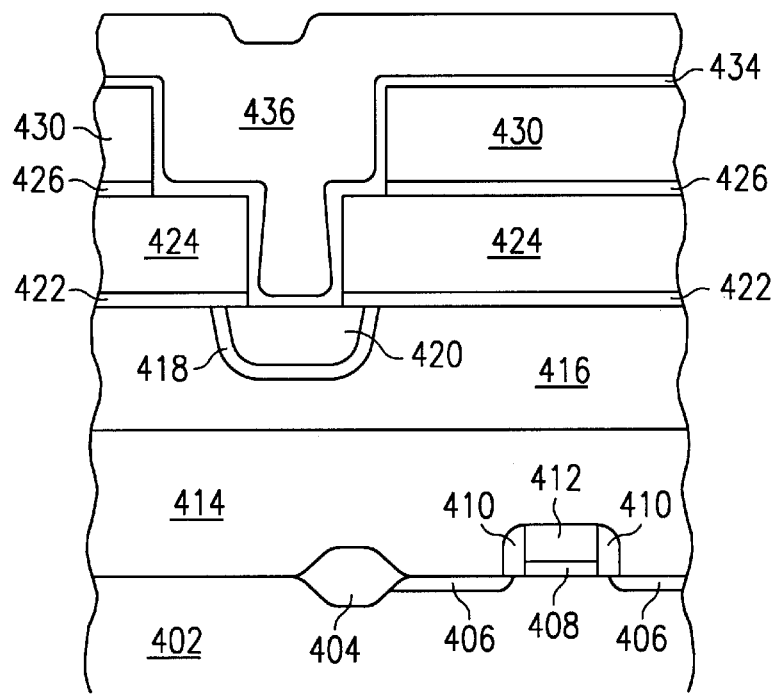

Referring to FIG. 1b, a liner layer 434 is formed on dielectric layer 430 and on conductor 420. Liner layer 434 is preferably comprised of Ta, TaN, Ta/TaN stack (or possibly even Ti, TiN, or a Ti/TiN stack), or any other refractory metal and is preferably formed by CVD or PVD. Next, conductor 436 is formed, preferably either by PVD or CVD, as a blanket. Conductor 436 is preferably comprised of copper (more preferably substantially pure copper), but it may be comprised of a copper alloy (such as aluminum doped with copper or copper doped with aluminum and/or silicon) or any refractory metal. Conductor 436 is preferably comprised of a material that has a low resistivity, is readily integrated into a standard semiconductor device fabrication methodology, and resistive to electromigration. To date the best candidate seems to be copper.

Figure 1C:
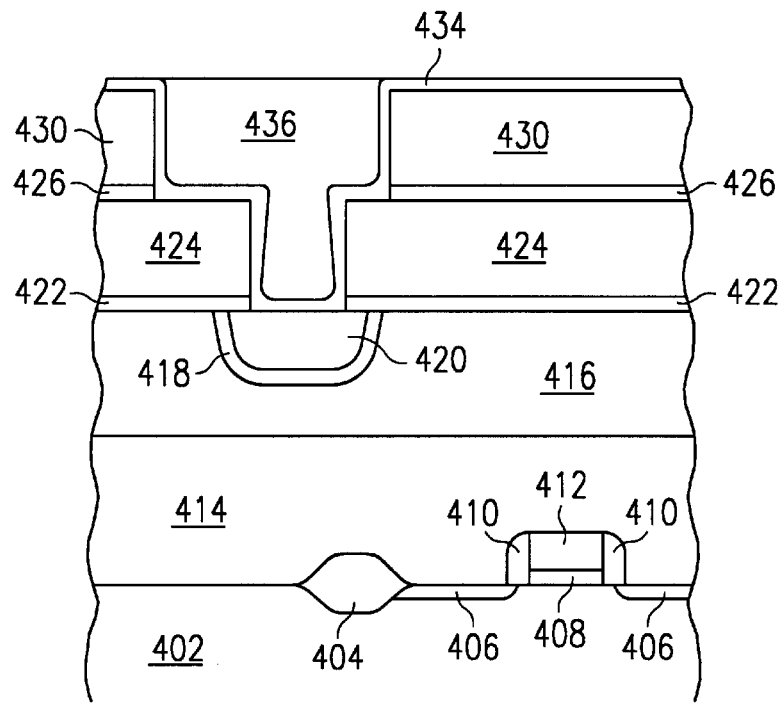

Referring to FIG. 1c, at this point using standard semiconductor processing the portions of conductor 436 and liner 434 which overlie dielectric layer 430 would be polished using a single CMP tool and only one slurry. This is not preferable because this type of methodology will result in the dishing of conductor 436 and the erosion of dielectric layer 430. Hence, the slurry and method of the instant invention was developed so as to overcome these two problems while ending up with a substantially planar structure as compared to the structure formed using conventional methodology. Using the method of the instant invention, copper layer 436 is polished using a slurry that more readily removes copper as compared to liner 434 (which is preferably comprised of a Ta/TaN stack, substantially pure Ta or substantially pure TaN). Preferably, the slurry will have a selectivity of around 100:1 (meaning 100 parts of copper removed to every 1 part of the liner removed) or greater. This is preferable so that when the CMP tool starts to polish layer 434 after conductor 436 is cleared over layer 430, this event becomes evident and the removal process greatly decreases. An example of such a slurry is the Jasper II slurry by Rodel. Other slurries with lower selectivity may be used. Examples of these slurries include the Mica I slurry by Rodel (with a selectivity of around 20–30:1) and the EPC 4100 series slurries by Cabot (with a selectivity of around 15:1).

Figure 1D:
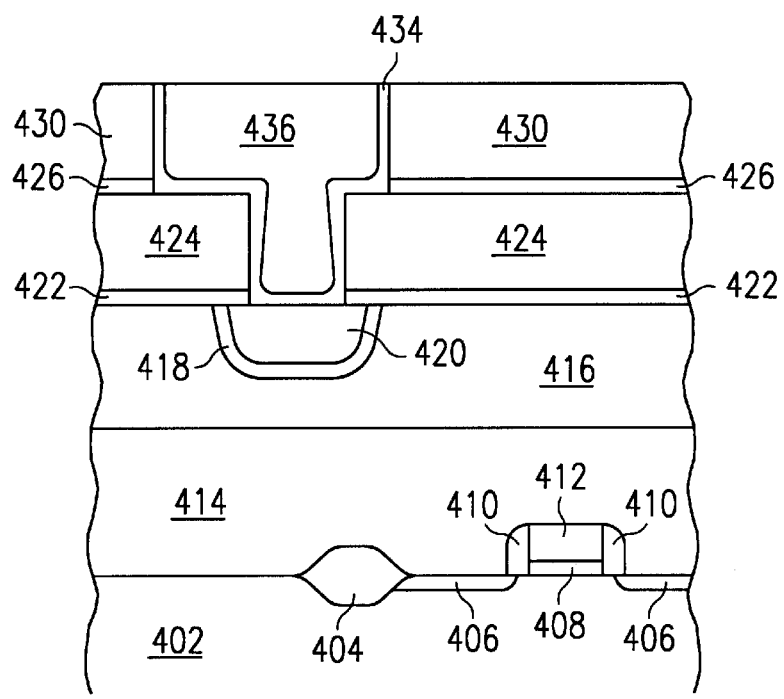

Referring to FIG. 1d, the portion of liner layer 434 which overlies dielectric layer 430 is removed, next, using a different slurry than that used to remove conductor 436. Preferably, the removal of layer 436 and layer 434 are accomplished using the same CMP tool with the delivery of the slurry used to remove layer 436 being discontinued and the delivery of the slurry to remove layer 434 beginning. However, they can be removed in separate CMP tools. The slurry used for this step is preferably comprised of a particulate (such as fumed silica—which is preferably around 3 to 4 percent by weight of the total mixture), a basic solution such that the slurry has a pH around 11 to 12 (such as potassium hydroxide), a wetting agent (such as Triton X-100), and a diluting agent (such as water, glycol, or any other hydrophilic solution) so as to reduce the amount of particulate down to around 2 to 5 percent by weight of the total solution. The diluting agent may or may not be required depending on the amount of particulate used. This slurry should result in around a selectivity of around 12:1 (removal of Ta or TaN):(removal of copper) and a removal rate of around 1.9 nm/sec of Ta or TaN. Note, though, that this slurry is particularly effective for the removal of Ta or TaN with respect to copper, and that this slurry may be optimized so as to effectively remove any of the other liner layers mentioned above with respect to any of the other conductors mentioned above.

Figure 2:
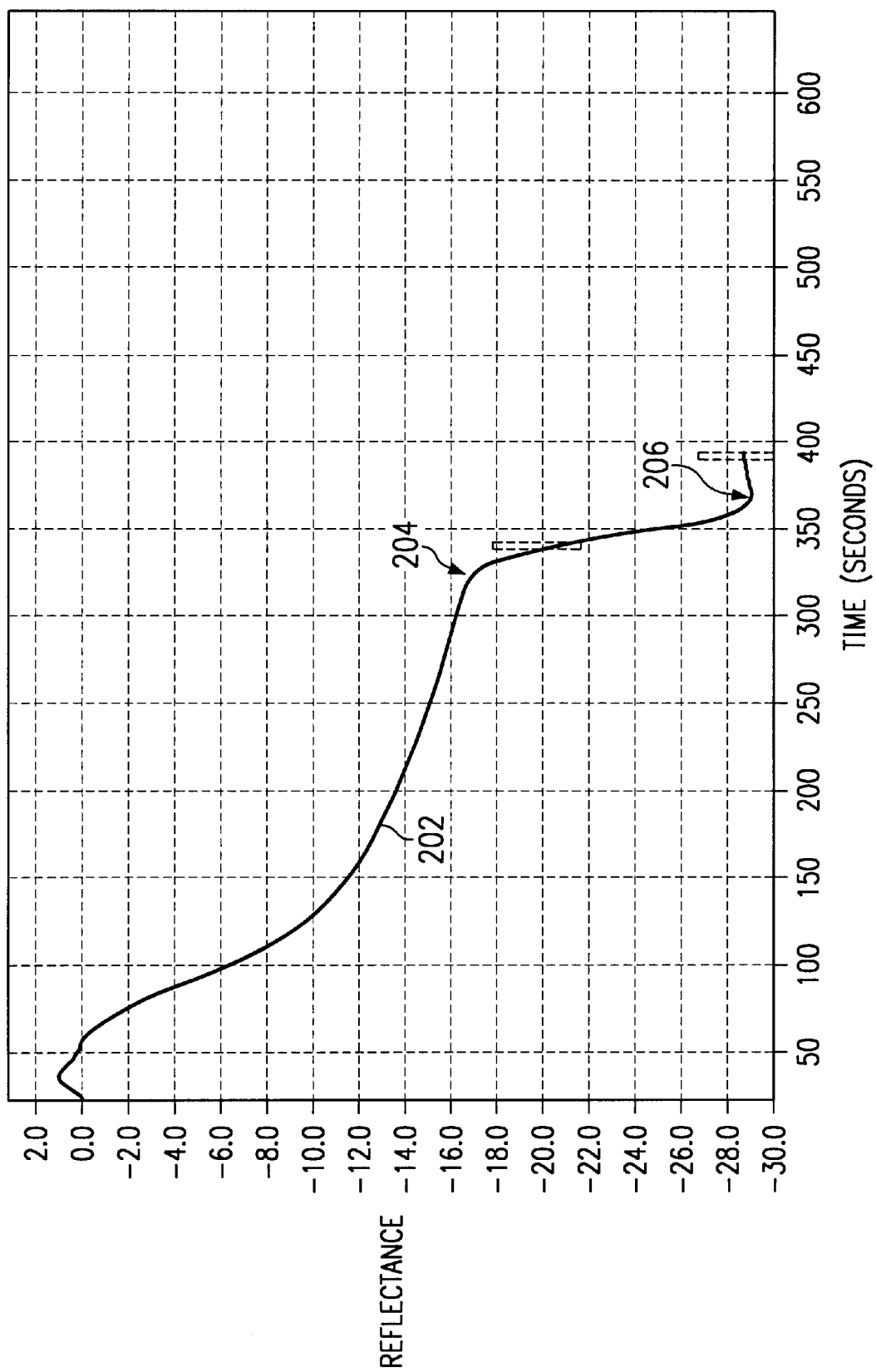
FIG. 2 is a graph of measured data where the vertical axis represents the measured reflectance off of a wafer as it is chemical-mechanically polished using the method of the instant invention.

FIG. 2 is a graph illustrating the removal of a copper layer overlying a TaN layer. The data illustrated in FIG. 2 was measured using a CMP system with an optical endpoint measurement system (specifically an Applied Materials Mirra Tool). The data illustrated in FIG. 2 was measured tinder the following tool conditions: the full table platen has a rotational speed of around 65 rpm, the carrier was offset from the center of rotation of the platen and had a rotational speed of around 64 rpm in the same direction as the rotation of the platen; and the pressure of the pad onto the wafer was around 4 psi. The slurry used to remove the copper layer was the Jasper II slurry by Rodel mentioned above and was flowed into the system at around 150 ml/min. As can be seen by graph 202, the removal of copper is fairly steady up to around point 204 where the copper is nearly completely removed and the TaN is almost uniformly exposed. At point 206, the removal of the underlying TaN layer begins. Hence, using the method of the instant invention, there is between 20 and 75 seconds (the time between points 204 and 206) in which to change the slurry so as to effectively remove the underlying TaN layer without substantially removing the copper layer.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating a semiconductor device with a patterned dielectric layer having an upper surface and an opening with a bottom and sidewalls formed over a semiconductor substrate, said method comprising the steps of:

forming a liner layer on said upper surface of said patterned dielectric layer and on said bottom and said sidewalls of said opening in said patterned dielectric layer;

forming a conductive layer on said liner layer, the conductive layer having a portion overlying said upper surface of said patterned dielectric layer and also a portion situated in said opening;

removing the portion of said conductive layer that overlies said upper surface of said patterned dielectric layer thereby exposing at least a portion of said liner layer on said upper surface of said patterned dielectric layer, while leaving the portion of said conductive layer situated in said opening of said dielectric layer, said step of removing the portion of said conductive layer accomplished by chemical mechanical polishing using a first slurry;

removing said exposed portion of said liner layer by chemical mechanical polishing using a second slurry;

and wherein said first slurry removes said conductive layer at a higher rate than said liner layer and said second slurry removes said liner layer at a higher rate than said conductive layer.

2. The method of claim 1, wherein said liner layer is comprised of a material selected from the group consisting of: Ta, TaN, Ta/TaN stack, Ti, TiN, a Ti/TiN stack, a refractory metal, and any combination thereof.

3. The method of claim 1, wherein said conductive layer is comprised of a material selected from the group consisting of: copper, a copper alloy, tungsten, aluminum, a refractory metal, and any combination thereof.

4. The method of claim 1, wherein said first slurry removes around 100 parts of said conductive layer to every one part of said liner layer.

5. The method of claim 1, wherein said first slurry removes around 50 parts of said conductive layer to every one part of said liner layer.

6. The method of claim 1, wherein said first slurry removes around 20 to 30 parts of said conductive layer to every one part of said liner layer.

7. The method of claim 1, wherein said first slurry removes around 15 parts of said conductive layer to every one part of said liner layer.

8. The method of claim 1, wherein said second slurry has a pH around 11 to 12.

9. The method of claim 8, wherein said second slurry is comprised of particulate and a wetting agent.

10. A method of fabricating a semiconductor device with a patterned dielectric layer having an upper surface and an opening with a bottom and sidewalls formed over a semiconductor substrate, said method comprising the steps of:

forming a liner layer on said upper surface of said patterned dielectric layer and on said bottom and said sidewalls of said opening in said patterned dielectric layer;

forming a conductive layer on said liner layer, the conductive layer having a portion overlying said upper surface of said patterned dielectric layer and also a portion situated in said opening;

removing the portion of said conductive layer that overlies said upper surface of said patterned dielectric layer thereby exposing at least a portion of said liner layer on said upper surface of said patterned dielectric layer, while leaving the portion of said conductive layer situated in said opening of said dielectric layer, said step of removing the portion of said conductive layer accomplished by chemical mechanical polishing using a first slurry;

removing said exposed portion of said liner layer by chemical mechanical polishing using a second slurry, wherein said second slurry has a pH around 11 to 12 and is comprised of a wetting agent, and of particulate of around 2 to 5 percent by weight of the total composition of said second slurry;

and wherein said first slurry removes said conductive layer at a higher rate than said liner layer and said second slurry removes said liner layer at a higher rate than said conductive layer.

11. The method of claim 1, wherein said second slurry removes around 20 parts of said liner layer to every one part of said conductive layer.

12. The method of claim 1, wherein said second slurry removes around 12 parts of said liner layer to every one part of said conductive layer.

13. The method of claim 1, wherein said second slurry removes around 10 parts of said liner layer to every one part of said conductive layer.

* * * * *